US009617146B2

United States Patent
Kim et al.

(10) Patent No.: US 9,617,146 B2
(45) Date of Patent: Apr. 11, 2017

(54) APPARATUS AND METHOD FOR FABRICATING NANO RESONATOR USING LASER INTERFERENCE LITHOGRAPHY

(71) Applicants: SAMSUNG ELECTRONICS CO., LTD., Suwon-si (KR); Korea University Industrial & Academic Collaboration Foundation, Seoul (KR)

(72) Inventors: Duck Hwan Kim, Goyang-si (KR); In Sang Song, Osan-si (KR); Jea Shik Shin, Hwaseong-si (KR); Ho Soo Park, Yongin-si (KR); Jae-Sung Rieh, Seoul (KR); Byeong Kwon Ju, Seoul (KR)

(73) Assignees: Samsung Electronics Co., Ltd., Suwon-si (KR); KOREA UNIVERSITY INDUSTRIAL & ACADEMIC COLLABORATION FOUNDATION, Seoul (KR)

( * ) Notice: Subject to any disclaimer, the term of this patent is extended or adjusted under 35 U.S.C. 154(b) by 0 days.

(21) Appl. No.: 14/094,178

(22) Filed: Dec. 2, 2013

(65) Prior Publication Data

US 2014/0191185 A1 Jul. 10, 2014

(30) Foreign Application Priority Data

Jan. 9, 2013 (KR) ........................ 10-2013-0002371

(51) Int. Cl.
*H03H 3/007* (2006.01)
*B81B 3/00* (2006.01)
*B81C 1/00* (2006.01)

(52) U.S. Cl.
CPC .......... *B81C 1/0019* (2013.01); *B81B 3/0018* (2013.01); *B81B 3/0021* (2013.01); *H03H 3/0072* (2013.01)

(58) Field of Classification Search
CPC .......... B81C 1/0019; B81C 2201/0191; B81C 1/00134; B81B 3/0018; H03H 3/0072
USPC ...... 257/24, 213, E21.002, E21.17, E21.347, 257/414, 415, 416; 977/742 M, 748, 847, 977/932, 840, 887, 888
See application file for complete search history.

(56) References Cited

U.S. PATENT DOCUMENTS

| 6,803,840 | B2 * | 10/2004 | Hunt et al. | 333/186 |
| 7,829,474 | B2 * | 11/2010 | Chae | 438/780 |
| 2005/0212014 | A1 * | 9/2005 | Horibe et al. | 257/213 |

(Continued)

FOREIGN PATENT DOCUMENTS

| JP | 2006-108378 A | 4/2006 |
| KR | 10-2010-0025603 A | 3/2010 |

(Continued)

OTHER PUBLICATIONS

Li et al. Bottom-up assembly of large-area nanowire resonator arrays. Nature Nanotechnology, vol. 3, Feb. 2008, pp. 88-92.*

(Continued)

*Primary Examiner* — Galina Yushina
(74) *Attorney, Agent, or Firm* — NSIP Law

(57) ABSTRACT

A method of fabricating a nano resonator, includes forming a line pattern in a first substrate, and transferring the line pattern to a second substrate including a gate electrode. The method further includes forming a source electrode and a drain electrode on the transferred line pattern.

6 Claims, 9 Drawing Sheets

(56) References Cited

U.S. PATENT DOCUMENTS

| | | | |
|---|---|---|---|
| 2006/0072891 A1* | 4/2006 | Lee | G02B 6/124 |
| | | | 385/129 |
| 2007/0032089 A1 | 2/2007 | Nuzzo et al. | |
| 2007/0105321 A1* | 5/2007 | Lee et al. | 438/270 |
| 2007/0218627 A1* | 9/2007 | Lattard | H01L 27/0203 |
| | | | 438/253 |
| 2009/0039293 A1 | 2/2009 | Park et al. | |
| 2010/0214034 A1* | 8/2010 | Peng et al. | 331/154 |
| 2010/0271003 A1* | 10/2010 | Jensen et al. | 324/76.49 |
| 2012/0028820 A1* | 2/2012 | Rhodes | B82Y 15/00 |
| | | | 506/9 |

FOREIGN PATENT DOCUMENTS

| | | | | |
|---|---|---|---|---|
| KR | 10-2010-0111516 A | 10/2010 | | |
| KR | 10-2011-0124590 A | 11/2011 | | |
| KR | 10-2011-0126373 A | 11/2011 | | |
| KR | 10-2012-0054881 A | 5/2012 | | |
| KR | WO2012087075 | * | 6/2012 | G03F 7/26 |
| KR | 10-2012-0072934 A | 7/2012 | | |

OTHER PUBLICATIONS

Wolferen et al. Laser Interference Lithography. In Lithography. Principles, Processes and Materials, pp. 133-148, 2011.*

* cited by examiner

APPARATUS AND METHOD FOR FABRICATING NANO RESONATOR USING LASER INTERFERENCE LITHOGRAPHY

CROSS-REFERENCE TO RELATED APPLICATION

This application claims the benefit under 35 USC 119(a) of Korean Patent Application No. 10-2013-0002371, filed on Jan. 9, 2013, in the Korean Intellectual Property Office, the entire disclosure of which is incorporated herein by reference for all purposes.

BACKGROUND

1. Field

The following description relates to an apparatus and a method for fabricating a nano resonator, using laser interference lithography.

2. Description of Related Art

A radio frequency nano-electro-mechanical system (RF NEMS) technology is an approach to fabricate a device of a nano scale. When a nano-scale device is applied to a nano resonator, the nano resonator may use a wider range of frequencies than that of an RF NEMS due to an operating frequency increasing with a reduction in scale, in an inversely proportional relationship.

A conventional RF NEMS technology fabricates a nano-scale device using electron beam lithography. To generate a nano-sized line pattern, a mask corresponding to the line pattern is needed. Accordingly, there is a demand for a method of fabricating a nano resonator, using a nano-sized line pattern generated without use of a mask.

SUMMARY

In one general aspect, there is provided a nano resonator including a gate electrode formed on a substrate. The nano resonator further includes a line pattern formed over the gate electrode and connecting a source electrode to a drain electrode.

In another general aspect, there is provided a method of fabricating a nano resonator, the method including forming a line pattern in a first substrate, and transferring the line pattern to a second substrate including a gate electrode. The method further includes forming a source electrode and a drain electrode on the transferred line pattern.

In still another general aspect, there is provided an apparatus that fabricates a nano resonator, the apparatus including a line pattern forming unit configured to form a line pattern in a first substrate, and a line pattern transferring unit configured to transfer the line pattern to a second substrate including a gate electrode. The apparatus further includes an electrode forming unit configured to form a source electrode and a drain electrode on the transferred line pattern.

Other features and aspects will be apparent from the following detailed description, the drawings, and the claims.

DETAILED DESCRIPTION

Figure 1:
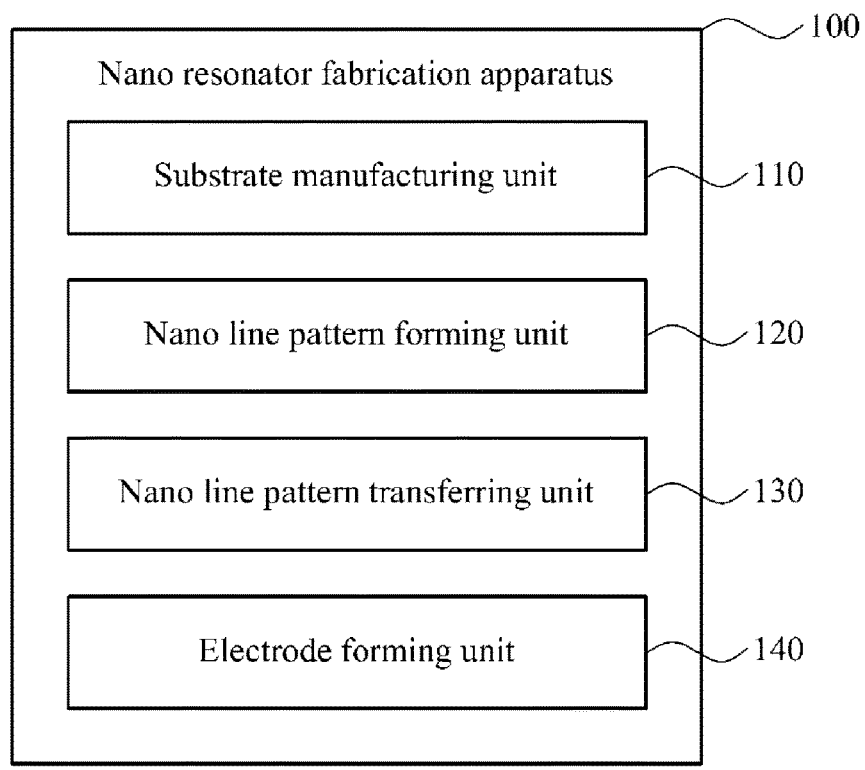
FIG. 1 is a diagram illustrating an example of an apparatus that fabricates a nano resonator.

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

FIG. 1 illustrates an example of an apparatus 100 that fabricates a nano resonator. Referring to FIG. 1, the apparatus 100 that fabricates the nano resonator (hereinafter, the nano resonator fabrication apparatus 100) includes a substrate manufacturing unit 110, a nano line pattern forming unit 120, a nano line pattern transferring unit 130, and an electrode forming unit 140.

The substrate manufacturing unit 110 manufactures a second substrate. The second substrate serves as a substrate of the nano resonator. The second substrate may include, for example, a flexible substrate made of a material selected from a group including silicon (Si), glass, polyimide (PI), and polyethylene terephthalate (PET).

The substrate manufacturing unit 110 forms a gate electrode on the second substrate. For example, the substrate manufacturing unit 110 may form an electrode pattern in the second substrate, using ultraviolet (UV) lithography, and may deposit a metal on the formed electrode pattern, to form the gate electrode on the second substrate.

Also, the substrate manufacturing unit 110 forms a support to which a nano line pattern is to be coupled, on the second substrate. For example, the substrate manufacturing unit 110 may pattern an area of the second substrate, using lithography, and may form the support on the patterned area, using an insulating material, for example, silicon dioxide ($SiO_2$). The support may be higher than the gate electrode.

The support includes a source support corresponding to a source electrode and a drain support corresponding to a drain electrode.

The nano line pattern forming unit 120 forms the nano line pattern in a first substrate, using laser interference lithography. The first substrate may include a lower silicon layer, an oxide layer, and an upper silicon layer that is formed into the nano line pattern. For example, the first substrate may correspond to a silicon on insulator (SOI) substrate. A further description of the nano line pattern forming unit 120 is provided with reference to FIG. 3, and a further description of the forming of the nano line pattern on the first substrate, using the laser interference lithography, is provided with reference to FIG. 4.

The nano line pattern transferring unit 130 transfers the nano line pattern formed in the first substrate to the second substrate manufactured by the substrate manufacturing unit 110. For example, the nano line pattern transferring unit 130 may separate the nano line pattern (e.g., a portion of the upper silicon layer) from the first substrate, using a polydimethylsiloxane (PDMS) stamp, and may transfer the separated nano line pattern to the second substrate. To facilitate the separation of the upper silicon layer of the first substrate that is formed into the nano line pattern, the nano line pattern transferring unit 130 may wet-etch the first substrate to remove the oxide layer. The nano line pattern transferring unit 130 transfers one side of the nano line pattern to the source support on the second substrate, and transfers and an opposite side of the nano line pattern to the drain support.

The electrode forming unit 140 forms the source electrode on the one side of the nano line pattern transferred to the second substrate, and forms the drain electrode on the opposite side of the nano line pattern transferred to the second substrate. In more detail, the electrode forming unit 140 forms the source electrode on the one side of the nano line pattern transferred to the source support, and forms the drain electrode on the opposite side of the nano line pattern transferred to the drain support. The PDMS stamp may be removed.

The nano resonator fabricated by the nano resonator fabrication apparatus 100 includes the gate electrode that creates a magnetic field, and the nano line pattern formed using the laser interference lithography. The nano line pattern connects the source electrode to the drain electrode, and may vibrate due to a presence of the magnetic field.

Figure 2:
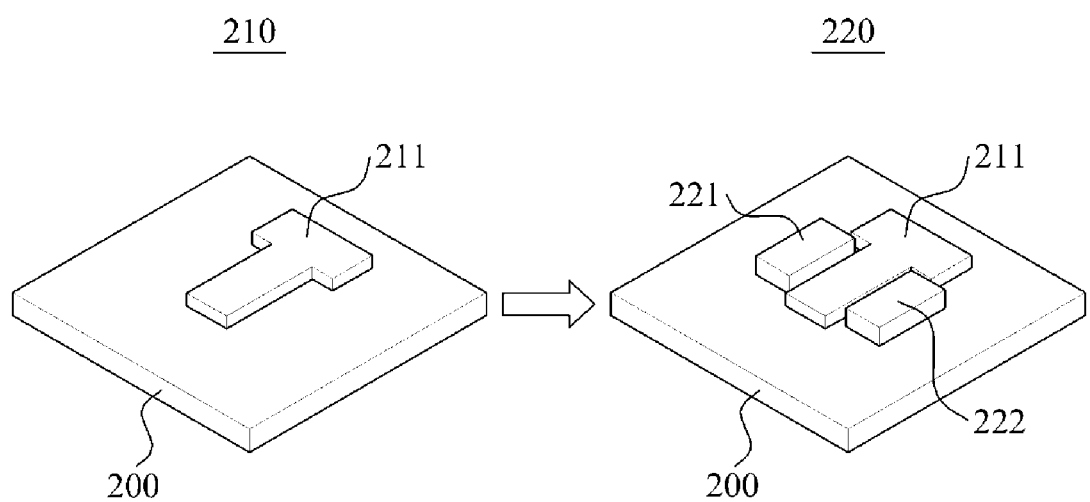
FIG. 2 is a diagram illustrating an example of a method of manufacturing a second substrate.

FIG. 2 illustrates an example of a method of manufacturing a second substrate 200. Referring to FIG. 2, in operation 210, the substrate manufacturing unit 110 of FIG. 1 forms a gate electrode 211 on the second substrate 200. For example, the substrate manufacturing unit 110 may form an electrode pattern in the second substrate 200, using UV lithography, and may deposit a metal on the formed electrode pattern, to form the gate electrode 211 on the second substrate 200.

In operation 220, the substrate manufacturing unit 110 forms a source support 221 corresponding to a source electrode and a drain support 222 corresponding to a drain electrode, on the second substrate 200. A position of the source support 221 and the drain support 222 that is shown in FIG. 2 is an illustrative example only, and may be changed. For example, the substrate manufacturing unit 110 may pattern an area of the second substrate, using lithography, and may form the source support 221 and the drain support 222 on the patterned area, using an insulating material, for example, $SiO_2$. The source support 221 and the drain support 222 may be higher than the gate electrode 211.

Figure 3:
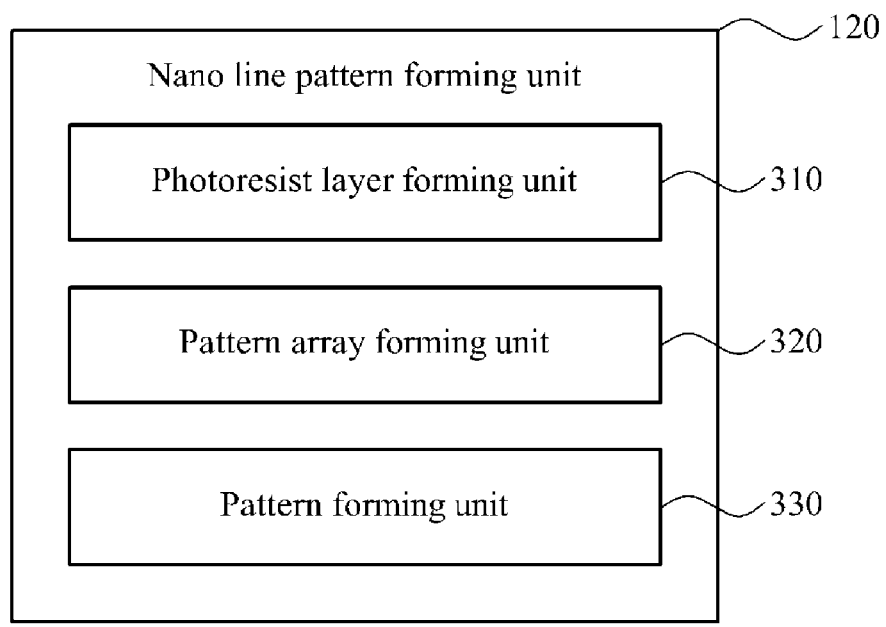
FIG. 3 is a diagram illustrating an example of a nano line pattern forming unit.

FIG. 3 illustrates an example of the nano line pattern forming unit 120. Referring to FIG. 3, the nano line pattern forming unit 120 includes a photoresist layer forming unit 310, a pattern array forming unit 320, and a pattern forming unit 330.

The photoresist layer forming unit 310 determines a size of a nano line pattern based on a distance between a source electrode and a drain electrode, and forms an etching photoresist layer on a first substrate based on the determined size of the nano line pattern. The photoresist layer forming unit 310 etches (e.g., performs reactive ion etching (RIE) of) the first substrate to remove an area of the first substrate, upon which the etching photoresist layer is not formed or absent. After the RIE is performed, the photoresist layer forming unit 310 removes the etching photoresist layer, and forms a laser photoresist layer on the first substrate. The laser photoresist layer may be formed using a photoresist material sensitive to a wavelength of a laser to be used for laser interference lithography. For example, the wavelength of the laser for the laser interference lithography may be about 256 nanometers (nm).

The pattern array forming unit 320 exposes a portion of the laser photoresist layer formed by the photoresist layer forming unit 310 to the laser to form a nano line pattern array by an effect of interference of light. That is, the pattern array forming unit 320 removes the portion of the laser photoresist layer that corresponds to a line width of the nano line patter, by a reaction of the photoresist layer to the laser, to form the nano line pattern array. The pattern array forming unit 320 may control a mirror angle used to expose the photoresist layer to the laser to control the line width and the spacing of the nano line pattern.

The pattern forming unit 330 etches the first substrate to remove a portion of the first substrate, upon which the nano line patter array is not formed or absent, to form the nano line patter. For example, the pattern forming unit 330 may perform RIE of the upper silicon layer of the first substrate to remove a portion of the upper silicon layer, upon which the nano line patter array is not formed or absent. The portion of the upper silicon layer, upon which the nano line pattern array is not formed or absent, corresponds to the line width and the spacing of the nano line pattern. After the etching is performed, a remaining portion of the upper silicon layer, upon which the nano line patter array is formed, avoids the etching and remain since the nano line patter array serves as a protective layer. The remaining portion of the upper silicon layer, upon which the nano line pattern array is formed, corresponds to the nano line pattern. That is, the pattern forming unit 330 removes only the portion of the upper silicon layer that is exposed by the laser to form the nano line pattern of the upper silicon layer. The patter forming unit 330 may remove the nano line pattern array from the nano line pattern.

Figure 4:
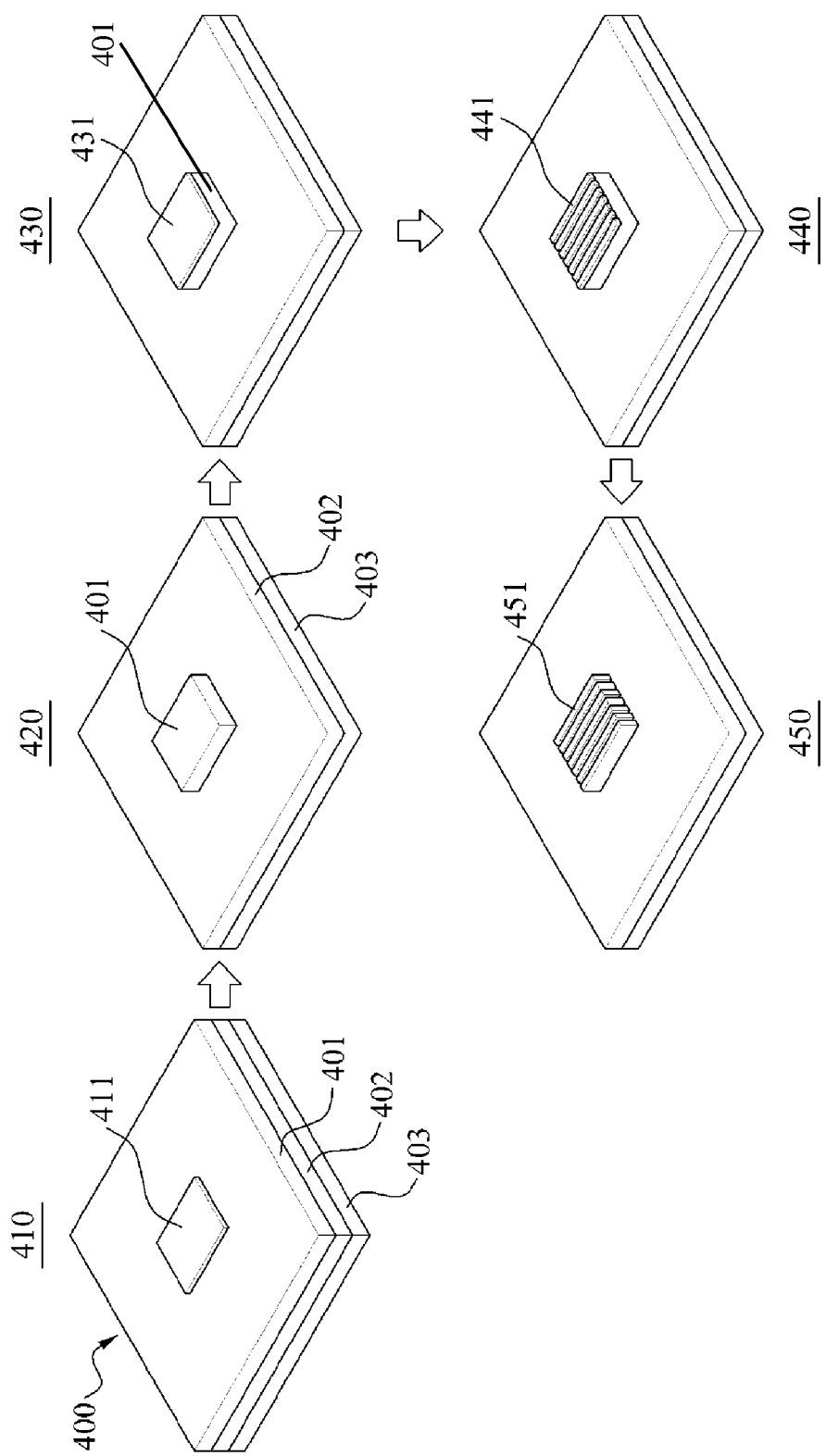
FIG. 4 is a diagram illustrating an example of a method of forming a nano line pattern.

FIG. 4 illustrates an example of a method of forming a nano line pattern 451. Referring to FIG. 4, in operation 410, the photoresist layer forming unit 310 of FIG. 3 determines a size of the nano line pattern based on a distance between a source electrode and a drain electrode, and forms an etching photoresist layer 411 on a first substrate 400 based on the determined size of the nano line pattern. The first substrate 400 includes an upper silicon layer 401, an oxide layer 402, and a lower silicon layer 403.

In operation 420, the photoresist layer forming unit 310 etches the upper silicon layer 401 to remove an area of the upper silicon layer 401, upon which the etching photoresist layer 411 is not formed or absent. For example, the photoresist layer forming unit 310 may perform RIE of the upper silicon layer 401. A remaining portion of the upper silicon layer 401, upon which the etching photoresist layer 411 is formed, avoids the etching and remains since the etching photoresist layer 411 serves as a protective layer. After the etching is performed, the photoresist layer forming unit 310 removes the etching photoresist layer 411.

In operation 430, the photoresist layer forming unit 310 forms a laser photoresist layer 431 on the remaining portion of the upper silicon layer 401. The laser photoresist layer 431 may be formed using a photoresist material sensitive to a wavelength of a laser to be used for laser interference lithography.

In operation 440, the patter array forming unit 320 of FIG. 3 exposes a portion of the laser photoresist layer 431 to the laser to form a nano line pattern array 441 by an effect of interference of light. The patter array forming unit 320 may control a mirror angle used to expose the laser photoresist layer 431 to the laser to control a line width and a spacing of the nano line patter array 441. The nano line patter array 441 corresponds to a portion of the laser photoresist layer 431 that is removed by a reaction to the laser.

In operation 450, the pattern forming unit 330 of FIG. 3 etches (e.g., performs RIE of) the upper silicon layer 401 to remove a portion of the upper silicon layer 401, upon which the nano line pattern array 441 is not formed or absent, to form the nano line pattern 451. A remaining portion of the upper silicon layer 401 that is below the remaining portion of the laser photoresist layer 431, namely, the nano line pattern array 441, avoids the etching since the laser photoresist layer 431 serves as a protective layer. In contrast, the portion of the upper silicon layer 401 that is below the portion of the laser photoresist layer 431 that is removed by the exposure to the laser, is removed by the etching. Accordingly, the nano line pattern 451 corresponding to the remaining portion of the upper silicon layer 401 that is below the nano line pattern array 441 is formed. The pattern forming unit 330 removes the nano line pattern array 441 from the nano line pattern 451.

Figure 5:
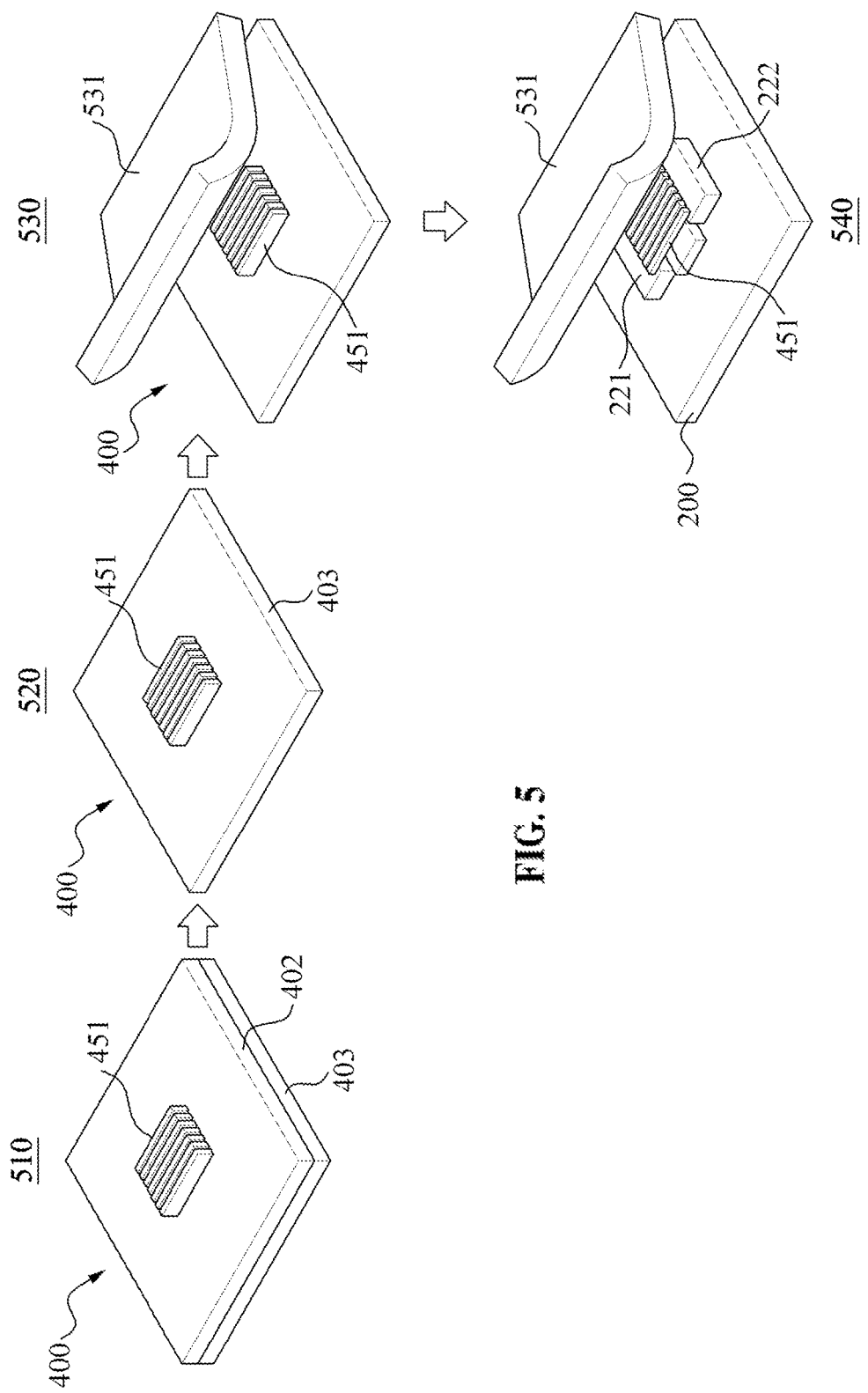
FIG. 5 is a diagram illustrating an example of a method of transferring a nano line pattern.

FIG. 5 illustrates an example of a method of transferring a nano line pattern 451. Referring to FIG. 5, in operation 510, the nano line patter forming unit 120 of FIG. 1 forms the nano line pattern 451 on an oxide layer 402 so that a first substrate 400 includes the nano line patter 451, the oxide layer 402, and a lower silicon layer 403. For example, the nano line pattern 451 may be formed by etching an upper silicon layer of the first substrate 400, using a nano line pattern array formed on the upper silicon layer, as described with reference to FIGS. 3 and 4.

In operation 520, the nano line pattern transferring unit 130 of FIG. 1 wet-etches the first substrate 400 to remove the oxide layer 402 coupled to the nano line pattern 451. After removing the oxide layer 402, the nano line pattern 451 is overlaid on the lower silicon layer 403, and is made separable from the first substrate 400.

In operation 530, the nano line patter transferring unit 130 separates the nano line pattern 451 from the first substrate 400, using a PDMS stamp 531.

In operation 540, the nano line pattern transferring unit 130 transfers the nano line patter 451 separated using the PDMS stamp 531 to the second substrate 200 of FIG. 2. In more detail, the nano line patter transferring unit 130 transfers one side of the nano line pattern 451 to the source support 221 of FIG. 2 on the second substrate 200, and transfers an opposite side of the nano line patter 451 to the drain support 222 of FIG. 2 on the second substrate 200.

Figure 6:
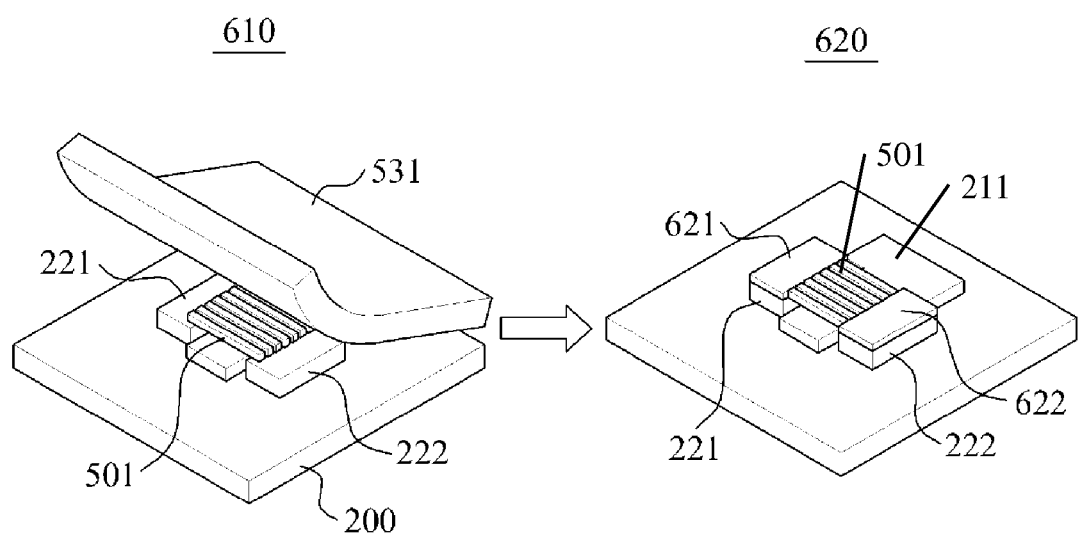
FIG. 6 is a diagram illustrating an example of a method of forming a source electrode and a drain electrode.

FIG. 6 illustrates an example of a method forming a source electrode 621 and a drain electrode 622. Referring to FIG. 6, in operation 610, the nano line pattern transferring unit 130 of FIG. 1 transfers the nano line pattern 501 of FIG. 5 that is separated using the PDMS stamp 531 of FIG. 5 to the second substrate 200 of FIG. 2. In more detail, the nano line pattern transferring unit 130 transfers the one side of the nano line pattern 501 to the source support 221 of FIG. 2 on the second substrate 200, and transfers the opposite side of the nano line pattern 501 to the drain support 222 of FIG. 2 on the second substrate 200.

In operation 620, the electrode forming unit 140 of FIG. 1 forms the source electrode 621 on the one side of the nano line pattern 501 transferred to the source support 221, and forms the drain electrode 622 on the opposite side of the nano line pattern 501 transferred to the drain support 222, to fabricate a nano resonator. The PDMS stamp 531 is removed.

The nano resonator fabricated by the nano resonator fabrication apparatus 100 includes the gate electrode 211 that creates a magnetic field, and the nano line pattern 501 formed using laser interference lithography. The nano line pattern 501 connects the source electrode 621 to the drain electrode 622, and may vibrate due to a presence of the magnetic field.

Figure 7:
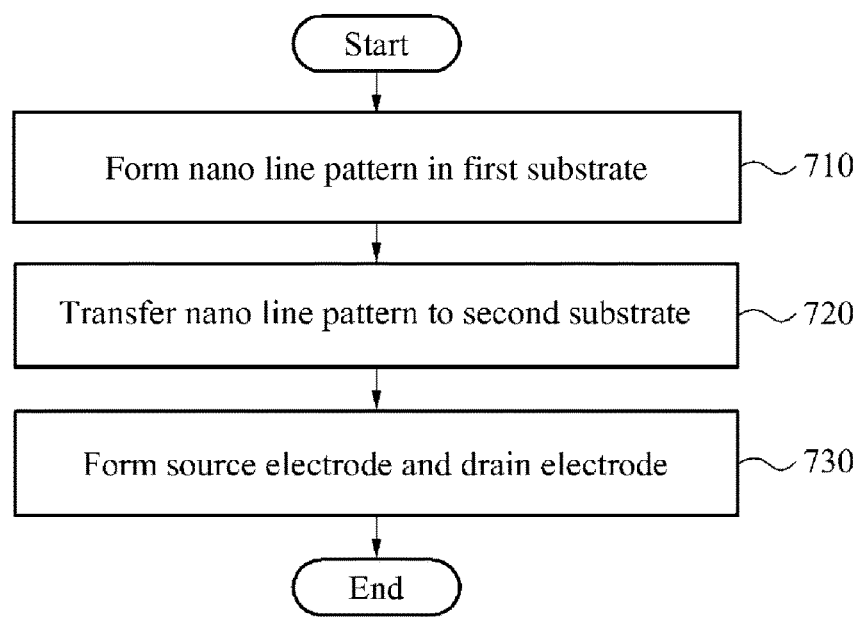
FIG. 7 is a flowchart illustrating a method of fabricating a nano resonator.

FIG. 7 is a flowchart illustrating an example of a method of fabricating a nano resonator. Referring to FIG. 7, in operation 710, the nano line pattern forming unit 120 of FIG. 1 forms a nano line pattern in a first substrate, using laser interference lithography. A method of forming the nano line pattern in the first substrate, using the laser interference lithography, is described in further detail with reference to FIG. 8.

In operation 720, the nano line pattern transferring unit 130 of FIG. 1 transfers the nano line pattern to a second substrate, upon which a gate electrode, a source support, and a drain support are formed. The second substrate may be manufactured by the substrate manufacturing unit 110 of FIG. 1. In more detail, the nano line pattern transferring unit 130 transfers one side of the nano line pattern to the source support, and transfers an opposite side of the nano line pattern to the drain support.

In operation 730, the electrode forming unit 140 of FIG. 1 forms a source electrode on the one side of the nano line pattern transferred to the second substrate, and forms a drain electrode on the opposite side of the nano line pattern. In more detail, the electrode forming unit 140 forms the source electrode on the one side of the nano line pattern transferred to the source support, and forms the drain electrode on the opposite side of the nano line pattern transferred to the drain support.

Figure 8:
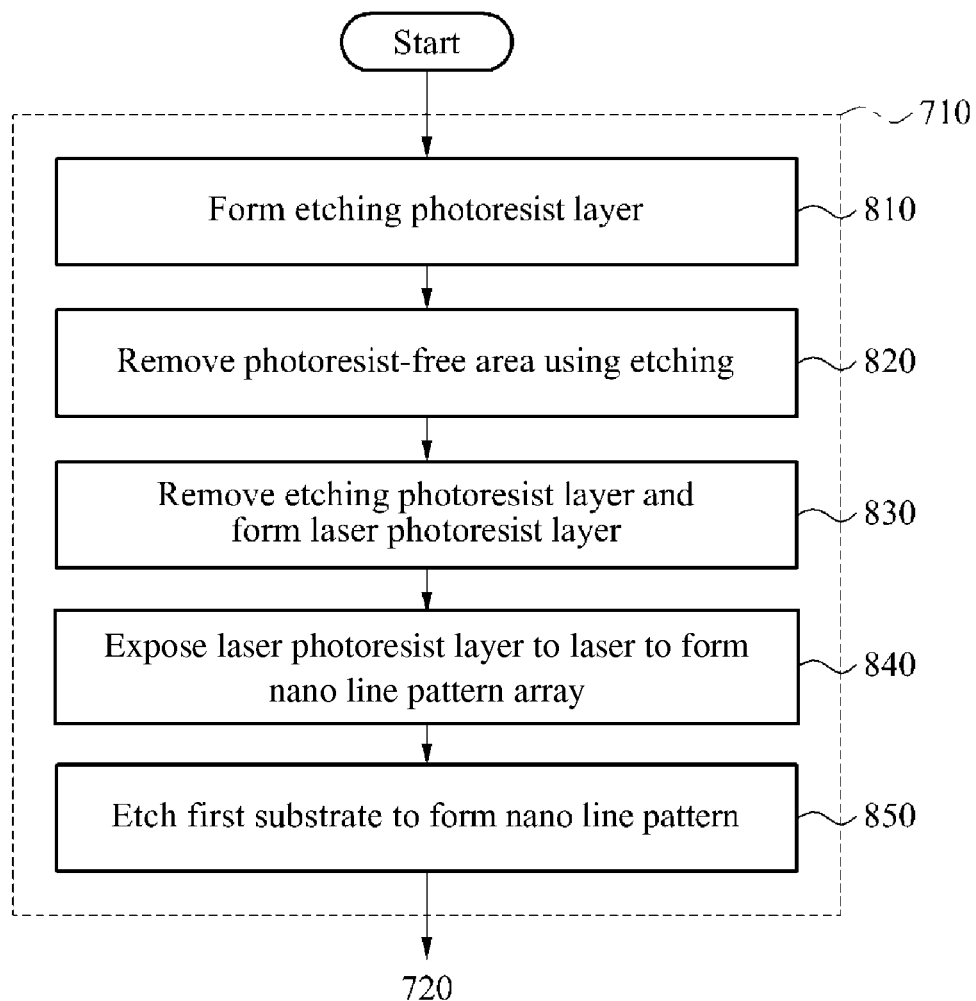
FIG. 8 is a flowchart illustrating a method of forming a nano line pattern.

FIG. 8 is a flowchart illustrating an example of a method of forming a nano line pattern. Operations 810 through 850 are included in operation 710 of FIG. 7.

In operation 810, the photoresist layer forming unit 310 of FIG. 3 forms an etching photoresist layer on a first substrate based on a size of the nano line pattern determined based on a distance between a source electrode and a drain electrode.

In operation 820, the photoresist layer forming unit 310 removes an area of the first substrate, upon which the etching photoresist layer is not formed or absent (hereinafter, a photoresist-free area), using etching (e.g., RIE) of the first substrate.

In operation 830, the photoresist layer forming unit 310 removes the etching photoresist layer from the first substrate, and forms a laser photoresist layer on the first substrate, using a photoresist material sensitive to a wavelength of a laser.

In operation 840, the pattern array forming unit 320 of FIG. 3 exposes the laser photoresist layer to the laser to form a nano line pattern array by an effect of interference of light. In more detail, the nano line pattern array is formed by removing a portion of the laser photoresist layer corresponding to a line width and a spacing of the nano line pattern, by a reaction of the laser photoresist layer to the laser. The pattern array forming unit 320 may control a mirror angle used to expose the photoresist layer to the laser to control the line width and the spacing of the nano line pattern.

In operation 850, the pattern forming unit 330 of FIG. 3 etches the first substrate to remove a portion of the first substrate, upon which the nano line pattern array is not formed or absent, to form the nano line pattern. For example, the pattern forming unit 330 may perform RIE of the upper silicon layer of the first substrate to remove the portion of the upper silicon layer, upon which the nano line pattern array is not formed or absent. The portion of the upper silicon layer, upon which the nano line pattern array is not formed or absent, corresponds to the line width and the spacing of the nano line pattern. After the etching, a remaining portion of the upper silicon layer, upon which the nano line pattern array is formed, may avoid the etching and remain since the nano line pattern array serves as a protective layer. The remaining portion of the upper silicon layer, upon which the nano line pattern array is formed, corresponds to the nano line pattern. That is, the pattern forming unit 330 may remove only the portion of the upper silicon layer that is exposed by the laser to form the nano line pattern of the upper silicon layer. The pattern forming unit 330 may remove the nano line pattern array from the nano line pattern.

Figure 9:
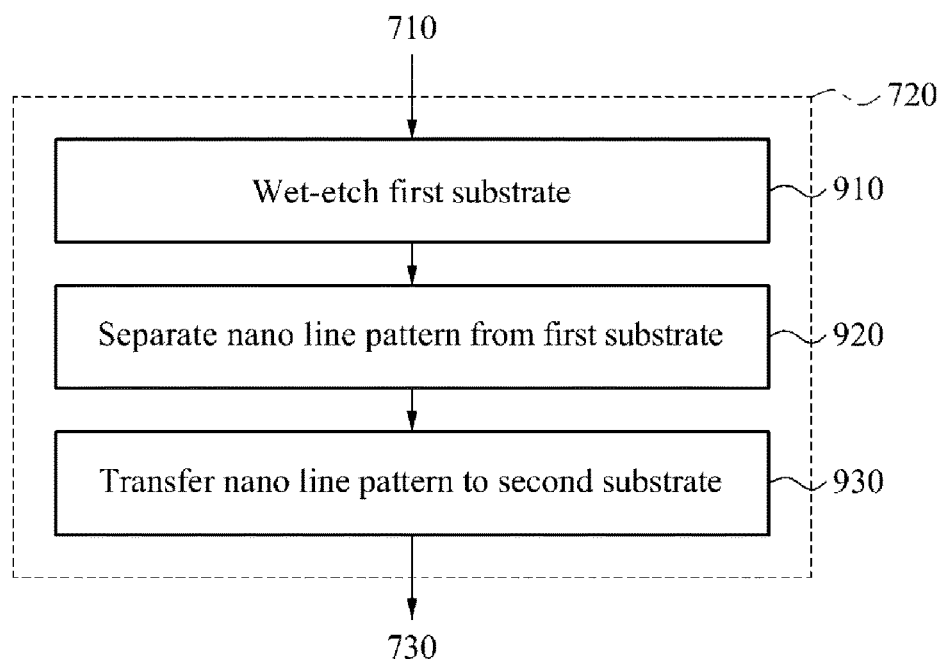
FIG. 9 is a flowchart illustrating a method of transferring a nano line pattern.

FIG. 9 is a flowchart illustrating an example of a method of transferring a nano line pattern. Operations 910 through 930 are included in operation 720 of FIG. 7.

In operation 910, the nano line pattern transferring unit 130 of FIG. 1 wet-etches a first substrate, including a nano line pattern, an oxide layer, and a lower silicon layer, to remove the oxide layer. Accordingly, the nano line patter is in an easily-separable state from the first substrate, namely, the lower silicon layer.

In operation 920, the nano line pattern transferring unit 130 separates the nano line pattern from the wet-etched first substrate, namely, the lower silicon layer. The nano line pattern may be separated using a PDMS stamp.

In operation 930, the nano line pattern transferring unit 130 transfers the separated nano line pattern to a second substrate, upon which a gate electrode, a source support, and a drain support are formed. In more detail, the nano line pattern transferring unit 130 transfers one side of the nano line pattern to the source support, and transfers an opposite side of the nano line pattern to the drain support. The PDMS stamp may be removed.

The various units and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may include various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions that control a processing device to implement a software component may include a computer program, a piece of code, an instruction, or some combination thereof, that independently or collectively instructs or configures the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments that implement the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An RF nano resonator, comprising:
    a gate electrode and at least one support formed on a target substrate, and
    a planar member including a line pattern comprising a plurality of nano lines, the planar member formed over the at least one support and the gate electrode and connecting a source electrode to a drain electrode disposed over the planar member,
    wherein the line pattern is obtained by forming nano lines on a transfer substrate using laser interference lithography and is transferred from the transfer substrate to the target substrate to be positioned over the gate electrode,
    wherein the source electrode is formed on a side portion of an upper surface of the line pattern after the line pattern is transferred from the transfer substrate to the target substrate, and the drain electrode is formed on an opposite side portion of the upper surface of the line pattern after the line pattern is transferred from the transfer substrate to the target substrate.

2. The RF nano resonator of claim 1,
    wherein the at least one support comprises:
    a source support formed on the target substrate, a side portion of the planar member including the line pattern being formed on the source support; and
    a drain support formed on the target substrate, an opposite side portion of the planar member including the line pattern being formed on the drain support,
    wherein the source and drain supports are higher than the gate electrode to separate the line pattern therefrom by a predetermined distance.

3. The RF nano resonator of claim 1, wherein the line pattern is formed by forming a photoresist layer on the transfer substrate, and etching the transfer substrate to remove a portion thereof, on which a line patter array is absent, to form the line pattern.

4. The RF nano resonator of claim 3, wherein the line pattern array is formed by exposing, to a laser radiation, a portion of the photoresist layer that corresponds to a spacing between the to be formed nano lines of the line patter to remove this portion of the photoresist layer.

5. The RF nano resonator of claim 1, wherein the planar member including the line pattern is separated from the transfer substrate using a polydimethylsiloxane (PDMS) stamp and transferred to the PDMS stamp, and
    wherein the separated line pattern is transferred from the PDMS stamp to the target substrate.

6. An RF nano device, comprising:
    a nano resonator comprising:
    a gate electrode and at least one support formed on a target substrate, and
    a planar member including a line pattern comprising a plurality of nano lines, the planar member formed over the at least one support and the gate electrode and connecting a source electrode to a drain electrode disposed over the planar member,
    wherein the line pattern is obtained by forming nano lines on a transfer substrate using laser interference lithography and is transferred from the transfer substrate to the target substrate i to be positioned above the gate electrode,
    wherein the source electrode is formed on a side portion of an upper surface of the line pattern after the line pattern is transferred from the transfer substrate to the target substrate, and the drain electrode is formed on an opposite side portion of the upper surface of the line pattern after the line pattern is transferred from the transfer substrate to the target substrate.

* * * * *